United States Patent
Maupu

(10) Patent No.: US 10,716,243 B2
(45) Date of Patent: Jul. 14, 2020

(54) USE OF STIRLING ENGINES FOR INFORMATION PROCESSING SYSTEM

(71) Applicant: BULL, Les Clayes sous Bois (FR)

(72) Inventor: Yann Maupu, Arpajon (FR)

(73) Assignee: BULL, Les Clayes sous Bois (FR)

( * ) Notice: Subject to any disclaimer, the term of this patent is extended or adjusted under 35 U.S.C. 154(b) by 410 days.

(21) Appl. No.: 15/031,417

(22) PCT Filed: Oct. 28, 2014

(86) PCT No.: PCT/EP2014/073149
§ 371 (c)(1),
(2) Date: Apr. 22, 2016

(87) PCT Pub. No.: WO2015/082136
PCT Pub. Date: Jun. 11, 2015

(65) Prior Publication Data
US 2016/0242327 A1 Aug. 18, 2016

(30) Foreign Application Priority Data

Oct. 24, 2013 (FR) ...................................... 13 60368

(51) Int. Cl.
*H05K 7/20* (2006.01)
*G06F 9/50* (2006.01)

(52) U.S. Cl.
CPC ....... *H05K 7/20781* (2013.01); *G06F 9/5094* (2013.01); *H05K 7/2079* (2013.01); *Y02D 10/22* (2018.01)

(58) Field of Classification Search
CPC ............ H05K 7/20745; H05K 7/2079; H05K 7/20781; F25B 27/02
See application file for complete search history.

(56) References Cited

U.S. PATENT DOCUMENTS

| 2005/0078447 A1* | 4/2005 | Hamann | .................. H01L 23/38 |
| | | | 361/689 |
| 2007/0101730 A1* | 5/2007 | Chen | ....................... F25D 21/04 |
| | | | 62/6 |

(Continued)

FOREIGN PATENT DOCUMENTS

CN 102346537 A1 2/2012

OTHER PUBLICATIONS

Kristian Fredslund et al: "Green Data Center Cooling", Aug. 19, 2009 (Aug. 19, 2009), XP055130815, Retrieved from the Internet: URL:http://pire.soe.ucsc.edu/sites/default/files/Green_Data_Center_Cooling_report.pdf, [retrieved on Jul. 22, 2014].

(Continued)

*Primary Examiner* — Brian M King

(74) *Attorney, Agent, or Firm* — Young & Thompson

(57) ABSTRACT

An information processing system (TS) includes: a set of information processing devices forming a plurality of electrical circuits (C1, C2, C3 . . . Cn) supplied with power via a power supply source (S), cooling elements (MR) being placed near at least part of the electrical circuits; at least one Stirling engine, the cooling elements (MR) of which form a hot source and produce a mechanical movement (Mvt) on the basis of a temperature differential ($\Delta T$) between the hot source and a cold source (SF); and a generator (G) providing an electric current ($i_G$) on the basis of the mechanical movement.

4 Claims, 3 Drawing Sheets

(56) References Cited

U.S. PATENT DOCUMENTS

Figure 3A:
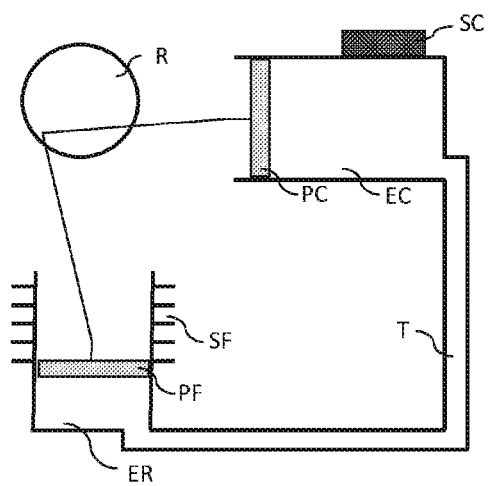

2010/0146996 A1* 6/2010 Campbell ............... F25B 27/02
62/119
2011/0096503 A1* 4/2011 Avery .................... F25B 27/02
361/701

OTHER PUBLICATIONS

International Search Report, dated Jul. 16, 2015, from corresponding PCT Application.

* cited by examiner

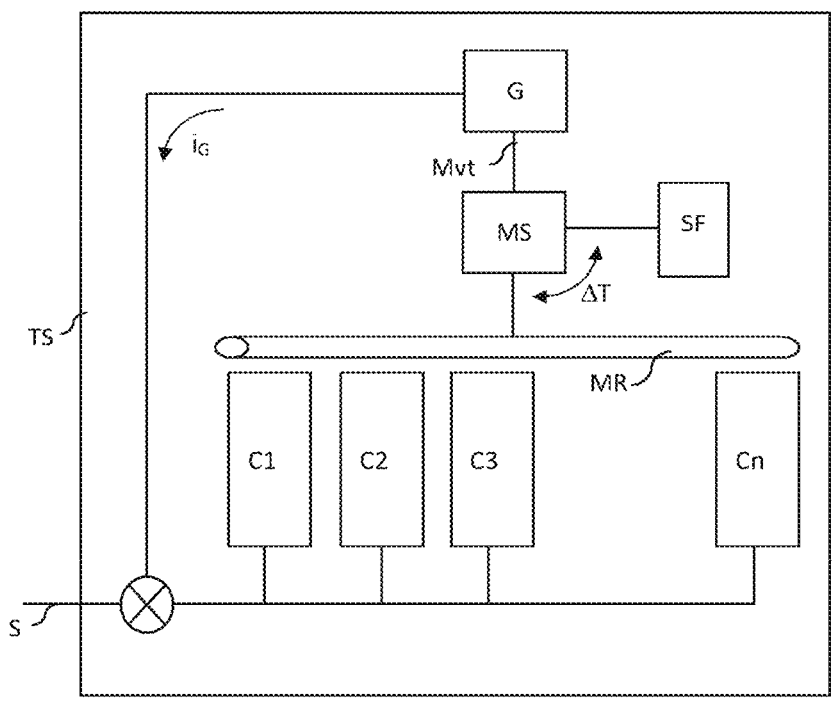
Fig. 1
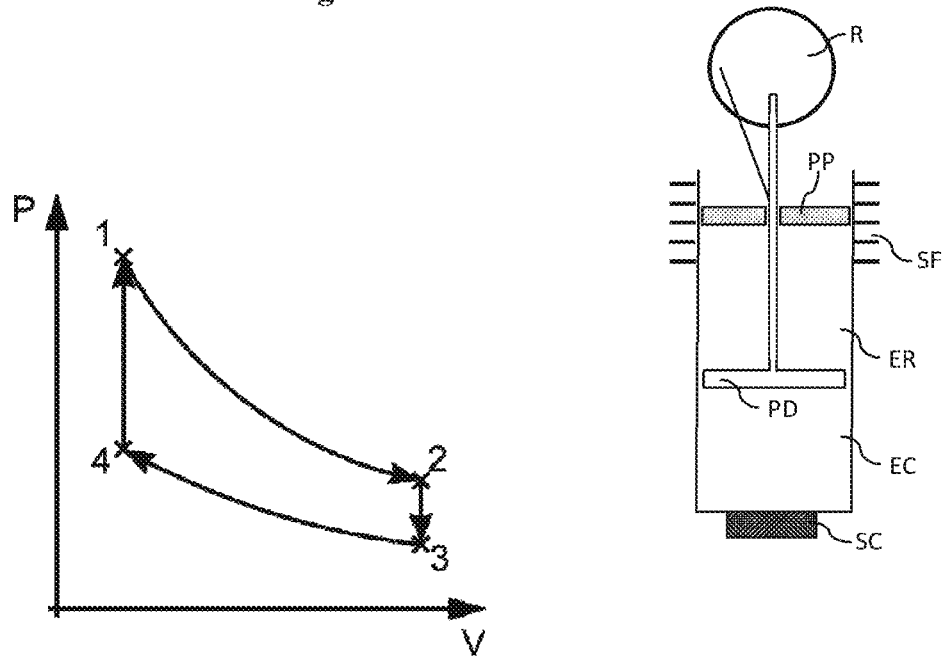
Fig. 2
Fig. 4

USE OF STIRLING ENGINES FOR INFORMATION PROCESSING SYSTEM

FIELD OF THE INVENTION

The invention relates to the field of information processing systems. It notably applies to systems comprising a large number of information processing devices commonly called «clusters» or «farms».

BACKGROUND OF THE INVENTION

An information processing device consists of a set of electric circuits giving the possibility of processing or storing information in memory. Generally, these circuits notably comprise so-called central processing units (CPUs), RAM (Random Access Memory) memories, and various general or specialized circuits interconnected with each other.

The grouping of several devices and of connecting them is known in order to form clusters or farms. These farms give the possibility of going beyond the limitations of an isolated device, therefore providing better availability and more significant resources for processing entrusted tasks.

These clusters are generally implemented as racks including a set of drawers in which are positioned the processing devices.

The information processing devices may be typically computers, i.e. general devices based on one or several central processing units (CPUs). In this case, the clusters are typically entrusted with intensive computing tasks, for example in the scientific field or else in digital imaging.

Another application may relate to the field of telecommunications. In this case, the information processing devices may be routers, switches or any other equipment unit handling large volumes of information.

Generally, the information processing devices include circuits which generate significant dissipation of energy as heat. Within the scope of a farm, this heat loss is all the more significant since the number of devices and therefore of circuits is significant, and that the latter are subject to a significant processing load.

This heat is inherent to the operation of electric circuits and corresponds to electric consumption. This energy is generally lost and may further damage the electric circuits when it causes a too high temperature.

Generally, provision is therefore made for extracting part of the heat with cooling means giving the possibility of discharging it towards the outside of the information processing system.

The use of this heat energy may then be provided for heating premises close to the information processing system, but this does not always have a great benefit.

SUMMARY OF THE INVENTION

The object of the invention is to use in a more efficient way the heat energy generated by the circuits of an information processing system. More specifically, it aims at lowering the electric consumption of such a system by cleverly using this heat energy.

For this purpose, the present invention proposes an information processing system including a set of information processing devices forming a plurality of electric circuits powered by a power supply source, cooling means positioned in proximity to at least one portion of said electric circuits; at least one Stirling engine for which said cooling means form a hot source and producing a mechanical movement from a difference in temperature between said hot source and cold source; and a generator providing an electric current from said mechanical movement.

According to preferred embodiments, the invention comprises one or several of the following features which may be used separately or partly combined with each other or as a full combination of each other:

said electric current is reintroduced in parallel on the current provided by said power supply source for powering said plurality of electric circuits;

which said cooling means (MR) include ducts for conveying the heat exchange fluid;

said cold source is localized in proximity to the outside of said system;

said ducts of said cooling means MR form a primary circuit in proximity to or in direct contact with said electric circuits, and a secondary circuit in contact, or in proximity to, with said primary circuit;

said hot source is formed by said primary circuit before contact with said secondary circuit, and said cold source is formed by said primary circuit before contact with said secondary circuit.

said at least one Stirling engine includes at least two Stirling engines laid out so as to produce a common mechanical movement.

said at least one Stirling engine is of the alpha type.

Another aspect of the invention relates to a method for an information processing system including a set of information processing devices forming a plurality of electric circuits powered by a power supply source, including a step for cooling at least one portion of said electric circuits, with cooling means;

a step for producing a mechanical movement from a difference in temperature between a hot source and a cold source by means of at least one Stirling engine, said cooling means of which forms said hot source; and a step for providing an electric current from said mechanical movement.

According to preferred embodiments, the invention comprises one or several of the following features which may be used separately or as a partial combination with each other or as a full combination of each other:

said current is reintroduced in parallel on the current provided by said power supply source for powering said plurality of electric circuits.

said at least one Stirling engine is of the alpha type.

Other features and advantages of the invention will become apparent upon reading the description which follows of a preferred embodiment of the invention, given as an example and with reference to the appended drawings.

SHORT DESCRIPTION OF THE DRAWINGS

FIG. 1 schematically illustrates a possible architecture for an information processing system according to an embodiment of the invention.

FIG. 2 schematically illustrates an exemplary Stirling thermodynamic cycle.

FIGS. 3a to 3d schematically illustrate an exemplary Stirling engine according to an embodiment of the invention with 4 moments of the Stirling thermodynamic cycle.

FIG. 4 schematically illustrates an exemplary Stirling engine according to one embodiment of the invention.

Figure 5:
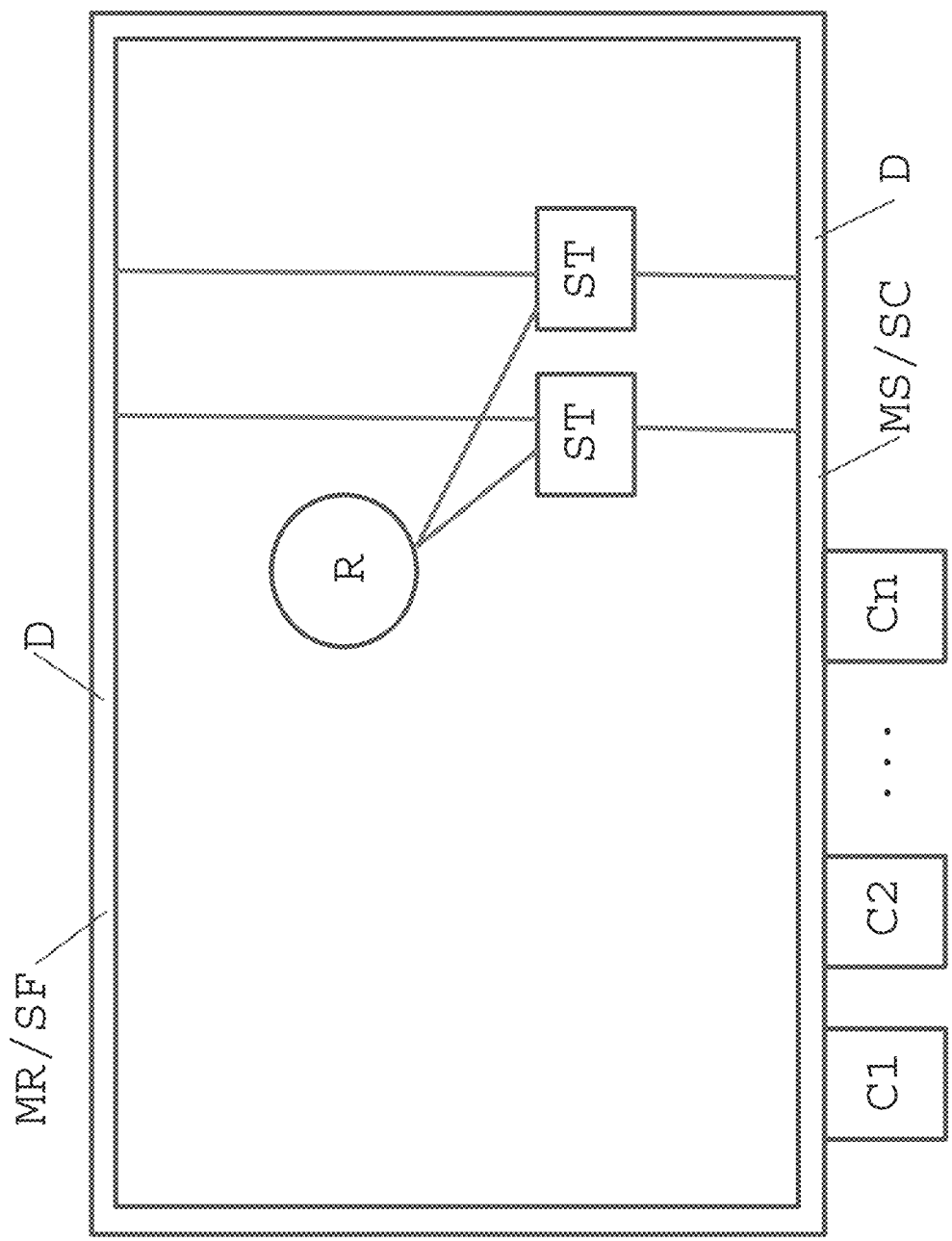

FIG. 5 schematically illustrates still another exemplary Stirling engine according to one embodiment of the invention.

DETAILED DESCRIPTION OF THE INVENTION

The information processing system TS illustrated in FIG. 1 may typically be a cluster or farm of information processing devices.

These devices form a plurality of electric circuits C1, C2, C3 ... Cn. The actual information processing devices are not illustrated in the figure for the sake of clarity and because the invention is mainly interested in the electric circuits with which they are made up.

The electric circuits making up an information processing device are diverse: these are central processing units (CPU for «Central Processing Unit»), additional processing units, graphic processing units, RAM («Random Access Memory») memories, etc.

The electric circuits are powered by a power supply source S. As this will be seen later on, according to an embodiment of the invention, an electric current $i_G$ generated by a generator G may be reintroduced in parallel on the current provided by this source S for powering the electric circuits.

The information processing system TS further includes cooling means MR positioned in proximity to at least some of the electric circuits.

According to an embodiment, the relevant electric circuits are only central processing units (CPUs).

According to another embodiment, the relevant electric circuits are the whole of the electric circuits.

According to another embodiment, the relevant electric circuits form a substantial portion of them.

The proportion of electric circuits taken into account may depend on the hardware architecture of the information processing system. Thus, the latter may be organized in a cabinet, or a rack, and the cooling means may be in proximity to the various drawers of the rack, but the choice may be made of not positioning them in proximity to certain drawers or to certain circuits for economy and cost-effectiveness considerations. It may actually be considered as sufficient to place the cooling means in proximity to the electric circuits which provide the most heat.

According to an embodiment, the cooling means MR include plural ducts (D) (shown in FIG. 5) for conveying a heat transfer liquid. This heat transfer liquid may be water. Additives may be added to this water in order to lower the solidification temperature or to avoid the formation of algae.

These ducts pass very close to or are in contact with the relevant electric circuits in order to capture at most the released heat, with good calorimetric efficiency.

The specific layout of the cooling means MR, as well as their arrangement relatively leave the scope of the present invention and are accessible to one skilled in the art. Notably, the notion of proximity depends on the implemented cooling means and may be determined by one skilled in the art according to the technology used.

An exemplary application consists of providing two distinct channeling circuits as cooling means MR:
- A primary circuit, i.e. with a first closed circuit in proximity to or in direct contact with the electric circuits, notably those producing heat.
- A secondary circuit, i.e. a second closed circuit in contact with or in proximity to the primary circuit. It thus recovers the heat stored by the primary circuit and brings it towards the outside of the information processing system TS.

The information processing system TS may be localized in a dedicated location, a «computing room» which may include other information processing systems. The temperature in such a room is often high and provision may be made so that the secondary circuit conveys the heat transfer liquid outside this room.

Provision may also be made so that it is cooled therein by radiators and/or fans.

The information processing system TS also includes a Stirling machine or engine ST. Such a machine gives the possibility of transforming heat energy into mechanical energy. The heat energy is directly related to a temperature difference $\Delta T$ between a hot source and a cold source SF.

According to the invention, the hot source is formed by cooling means MR. Indeed, as the latter capture the heat released by the electric circuits C1, C2, C3 ... Cn, they are substantially warmer than the environment.

The cold source SF should give the possibility of generating a temperature difference $\Delta T$ as great as possible. Indeed, the greater the difference, and the more significant will be the mechanical energy produced by the Stirling engine ST and therefore the electric energy provided by the generator G.

The cold source SF may therefore be at a distance from the electric circuits generating heat.

In so far that the information processing system TS is generally implemented in a cabinet or rack, or in a confined space, the temperature of this space is generally greater than that of the outside. Also, provision may be made so that the cold source is localized in proximity to the outside of the information processing system TS. The cold source may further include a radiator and/or a fan in order to improve the lowering of temperature.

Within the scope of an implementation including a dual cooling circuit as described earlier, the hot source SC is formed by the primary circuit, preferably before contact with the secondary circuit; and the cold source SF may for example be formed by this primary circuit after contact with the secondary circuit.

Other arrangements are of course possible, so as to maximize the temperature difference $\Delta T$. The embodiment described has the advantage of not requiring the addition of additional mechanisms to the information processing system TS.

The Stirling engine ST gives the possibility of converting the temperature difference $\Delta T$ into a mechanical movement Mvt. Typically, this mechanical movement Mvt is a movement of rotation, for example of an axis or of a wheel.

A Stirling machine (or engine) is an external energy engine based on a fluid subject to a 4-phase thermodynamic cycle and invented by Robert Stirling in 1816. The fluid is generally a gas (air, hydrogen, helium ... ).

The thermodynamic cycle is illustrated in FIG. 2.

The curve from point 1 to point 2 corresponds to isothermal expansion. The area is expanded and heated by the hot source SC. The gas follows an expansion at constant temperature. This expansion (increase in volume) allows generation of mechanical energy. As the pressure is high, the mechanical energy is significant.

The curve from point 2 to point 3 corresponds to cooling at constant volume (isochor). The gas passes into another space of the Stirling machine (the regenerator) and cools by transferring its heat to it which will be used for the next cycle.

The curve from point 3 to point 4 corresponds to isothermal cooling. The compression area is cooled, so that the gas undergoes compression at constant temperature. As the pressure is lower than in the expansion step, the mechanical energy required for this compression is smaller and at each cycle, an excess of mechanical energy is therefore collected.

The curve from point 4 to point 1 corresponds to isochor heating. The gas circulates in the regenerator and extracts heat.

Thus, mechanical energy is generated, which may cause a mechanical movement Mvt, by means of the pressure difference between the curves from points 1 to 2 and from 3 to 4. The production of this mechanical energy corresponds to a consumption of heat energy provided by the temperature difference ΔT.

Different implementations of Stirling engines exist. It is notably possible to distinguish three great families: the alpha machines, the beta machines and the gamma machines.

According to a preferential embodiment of the invention, the Stirling machine MS is a Stirling machine of the alpha type. The machine of the alpha type has the advantage of having a high power/size ratio and of not having unaccessible movable parts, so that its maintenance is relatively easy.

FIGS. 3a, 3b, 3c and 3d illustrate such a machine with 4 moments of the Stirling thermodynamic cycle.

A Stirling engine of the alpha type comprises two spaces, each closed by a piston and connected through a pipe T:

A heating space EC is formed by a «hot» power piston PC and is in contact with the hot source SC, formed by the cooling means, referenced as MR in FIG. 1.

A cooling space ER is formed by a «cold» power piston PF and is in contact with the cold source SF.

The hot PC and cold PF pistons are mechanically connected to a wheel R, in an off-center point of the latter so that the movement of translation of the pistons is converted into a circular movement of the wheel.

Further, the position of the pistons is shifted so that their respective cycles are phase-shifted by 90°. Thus, schematically, it is seen that in FIG. 3a, for example, the hot piston PC is at an excursion end, while the cold piston PF is at a half-stroke.

The wheel R may be an equivalent means, like an axis, allowing generation of a rotary movement under the action of the combined movements of both pistons PC, PF.

In a first phase of the Stirling thermodynamic cycle, the gas is heated in the heating space EC by the hot source SC. Upon heating, it tends to occupy more space and pushes the hot piston to the left in the figure, i.e. towards the end of the heating space EC. This displacement of the hot piston PC causes rotation of the wheel R.

In the same time, the expansion of the gas tends to also push the cold piston PF, for which the cycle is delayed by 90° with respect to the cycle of the heating space EC. FIG. 3a schematically illustrates the situation at the end of this first phase.

Figure 3B:
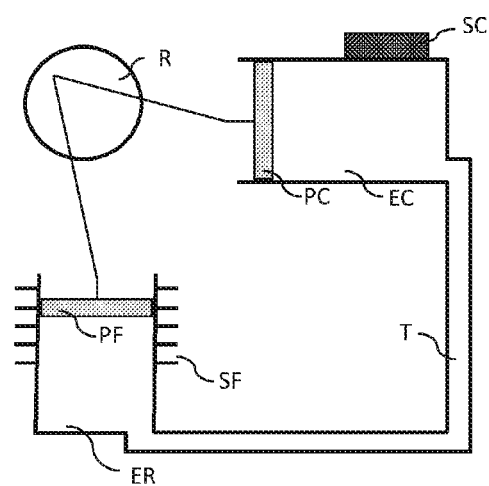

In the situation illustrated by FIG. 3b, the gas has reached its maximum expansion and the hot piston PC «moves down again» into the heating space EC (in the figure, it moves to the right) and pushes the gas towards the cooling space ER. The cold piston then continues to progress towards the end of this space ER (according to its 90° delay). The temperature of the gas is lowered since it is in majority in contact with the cold source SF in the cooling space.

Figure 3C:
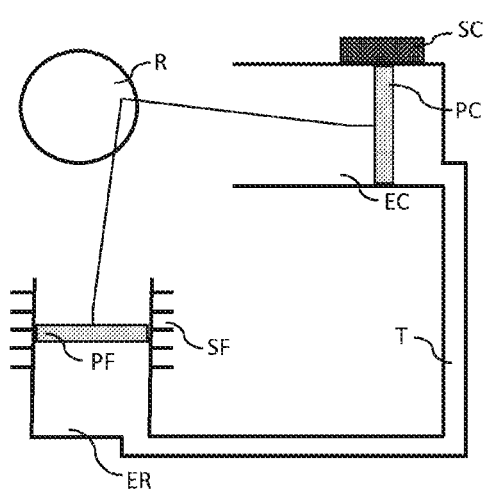

In FIG. 3c, nearly all the gas is in the cooling cylinder. The temperature continues to be lowered, as well as its pressure. The cold piston PF is then lowered.

Figure 3D:
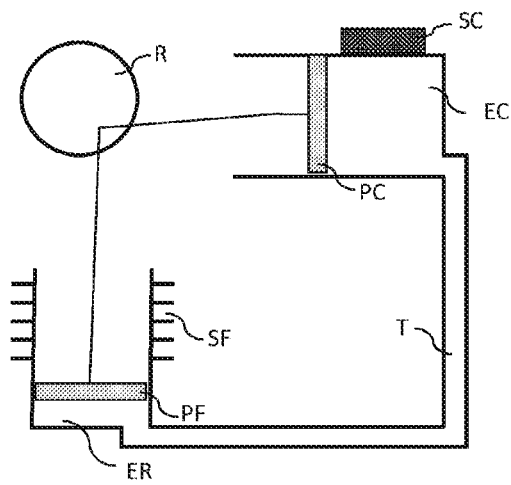

In FIG. 3d, the gas occupies its minimum volume. The cold piston PF has totally moved downwards in the cooling space, and the gas is therefore in majority in the heating space where it will warm up at the same time as its volume increases. The hot piston PC is then pushed towards the left and the cycle starts again.

Each movement of the pistons PC, PF generates rotary movements Mvt of the wheel R, via mechanical coupling means between the pistons and the wheel.

This rotary movement Mvt is transmitted to a generator G which provides electric current $i_G$ from this mechanical movement. This generator may be a standard generator per se.

According to an embodiment, the current $i_G$ provided by the generator G is reintroduced in parallel on the current provided by the power supply source S, in order to power the plurality of electric circuits.

In this way, the generated current may be easily adapted, notably in voltage, to the conditions of the information processing system TS. Indeed, notably when the cooling means MR are cooling means with a liquid, the voltage may be lowered to about 40 V in order to avoid electric risks in the case of a failure or leakage of a duct. The generator G may then directly provide an electric current with an adapted voltage (therefore, for example, 40 V).

An advantage of this implementation is to directly lower the electric consumption of the information processing system TS.

According to an embodiment, two Stirling machines MS are laid out so as to produce a common mechanical movement. Both of these machines may have the same cold SF and hot SC sources. They may be laid out so as to actuate the same wheel R so that their power is added: the produced mechanical power is thus twice greater.

FIG. 4 schematically illustrates a different implementation of the Stirling machine MS of the «beta» type.

The machine of the beta type only includes a single space on which are affixed the cold SF and hot SC sources. A displacement piston PD displaces the gas between a heating sub-space EC and a cooling sub-space ER. Both of these sub-spaces nevertheless actually belong to a same space, i.e. a same hardware element. With a phase shift, a power piston PP is also caused to move (here vertically) along the space ER/EC and causes, by mechanical coupling, the rotation of a wheel R or an equivalent mechanical element.

Of course, the present invention is not limited to the described and illustrated examples and to the embodiment, but it is capable of having many alternatives accessible to one skilled in the art.

The invention claimed is:

1. An information processing system, comprising:
a set of information processing devices forming a plurality of electric circuits powered by a power supply source;
a first closed circuit comprised of ducts that convey a heat transfer fluid, the ducts of the first closed circuit being in direct contact with at least one portion of the plurality of electric circuits, the first closed circuit conveying a heat transfer fluid, the plurality of electric circuits transferring heat to the heat transfer fluid of the first closed circuit;
a second closed circuit comprised of ducts that convey a further heat transfer fluid, the second closed circuit recovering heat stored by the first circuit;
at least one Stirling machine wherein
i) the first closed circuit is adapted to form a hot source of the at least one Stirling machine before contact with the second closed circuit, and ii) the first closed circuit is adapted to form a cold source of the at least one Stirling machine after contact with the second closed circuit, wherein when there is a temperature difference between said hot source and said cold source, the at least one Stirling machine produces a mechanical circular movement at an output wheel; and a generator connected to the output wheel, wherein the circular movement at the output wheel is transmitted to the generator to drive the generator to provide an electric current from said mechanical movement, said electric current providing power to the plurality of electric circuits.

2. The information processing system according to claim 1, wherein said electric current is reintroduced in parallel on the current provided by said power supply source for powering said plurality of electric circuits.

3. The information processing system according to claim 1, wherein said at least one Stirling engine includes at least two Stirling engines laid out so as to produce a common mechanical movement.

4. The information processing system according to claim 1, wherein said at least one Stirling engine is of the alpha type.

* * * * *